(12) United States Patent
Jung et al.

(10) Patent No.: US 10,784,415 B2
(45) Date of Patent: Sep. 22, 2020

(54) LIGHT-EMITTING DEVICE PACKAGE, MANUFACTURING METHOD THEREOF, AND VEHICLE LAMP AND BACKLIGHT UNIT INCLUDING SAME

(71) Applicant: SEOUL SEMICONDUCTOR CO., LTD, Ansan-si (KR)

(72) Inventors: Jung Hwa Jung, Ansan-si (KR); Seoung Ho Jung, Ansan-si (KR); Sung Ki Hwang, Ansan-si (KR)

(73) Assignee: SEOUL SEMICONDUCTOR CO., LTD., Ansan-si (KR)

( * ) Notice: Subject to any disclaimer, the term of this patent is extended or adjusted under 35 U.S.C. 154(b) by 0 days.

(21) Appl. No.: 16/254,357

(22) Filed: Jan. 22, 2019

(65) Prior Publication Data

US 2019/0157519 A1 May 23, 2019

Related U.S. Application Data

(63) Continuation of application No. 14/891,304, filed as application No. PCT/KR2014/004284 on May 13, 2014, now Pat. No. 10,236,421.

(30) Foreign Application Priority Data

| May 13, 2013 | (KR) | 10-2013-0053633 |
| Aug. 8, 2013 | (KR) | 10-2013-0094299 |
| Nov. 29, 2013 | (KR) | 10-2013-0147684 |

(51) Int. Cl.
*H01L 33/50* (2010.01)
*H01L 33/48* (2010.01)
(Continued)

(52) U.S. Cl.
CPC .......... *H01L 33/502* (2013.01); *H01L 27/156* (2013.01); *H01L 33/0095* (2013.01);
(Continued)

(58) Field of Classification Search
CPC . H01L 33/502; H01L 33/0095; H01L 33/486; H01L 33/50; H01L 33/58;
(Continued)

(56) References Cited

U.S. PATENT DOCUMENTS 8,921,877 B2    12/2014 Ito et al.
2006/0170332 A1  8/2006 Tamaki et al.
(Continued)

FOREIGN PATENT DOCUMENTS

CN    101378103 A    3/2009
EP       2492577       8/2012
(Continued)

OTHER PUBLICATIONS

Office Action in European Patent Application No. 14797634.4, dated Nov. 15, 2018 (8 pages).
(Continued)

*Primary Examiner* — Tu-Tu V Ho
(74) *Attorney, Agent, or Firm* — Perkins Coie LLP

(57) ABSTRACT

Disclosed are a light-emitting device package, a manufacturing method therefor, and a vehicle lamp and a backlight unit including the same. The light-emitting device package includes: a light-emitting chip having electrode pads positioned at a lower part thereof; a wavelength conversion unit for covering at least an upper surface and lateral surfaces of the light-emitting chip; and a reflective part which covers the lateral surfaces of the light-emitting chip. Accordingly, the light-emitting device package can be miniaturized and a separate substrate for forming a lens is not required.

18 Claims, 14 Drawing Sheets

(51) Int. Cl.
*H01L 33/60* (2010.01)
*H01L 27/15* (2006.01)
*H01L 33/00* (2010.01)
*H01L 33/58* (2010.01)
H01L 25/075 (2006.01)
H01L 33/14 (2010.01)
H01L 33/20 (2010.01)
H01L 33/36 (2010.01)

(52) U.S. Cl.
CPC ............ *H01L 33/486* (2013.01); *H01L 33/50* (2013.01); *H01L 33/58* (2013.01); *H01L 33/60* (2013.01); *H01L 25/0753* (2013.01); *H01L 33/14* (2013.01); *H01L 33/20* (2013.01); *H01L 33/36* (2013.01); *H01L 2924/0002* (2013.01); *H01L 2933/0016* (2013.01); *H01L 2933/0033* (2013.01); *H01L 2933/0041* (2013.01); *H01L 2933/0058* (2013.01)

(58) Field of Classification Search
CPC ... H01L 33/60; H01L 27/156; H01L 25/0753; H01L 33/14; H01L 33/20; H01L 33/36; H01L 2924/0002; H01L 2933/0016; H01L 2933/0033; H01L 2933/0041; H01L 2933/0058
USPC .......................................................... 257/98
See application file for complete search history.

(56) References Cited

U.S. PATENT DOCUMENTS

| | | | |
|---|---|---|---|
| 2008/0001528 A1 | 1/2008 | Eida | |
| 2008/0013329 A1 | 1/2008 | Takeda | |
| 2008/0310158 A1* | 12/2008 | Harbers | F21V 29/70 362/240 |
| 2011/0062479 A1 | 3/2011 | Sugano et al. | |
| 2011/0121731 A1* | 5/2011 | Tsutsumi | H01L 25/0753 315/77 |
| 2011/0207253 A1 | 8/2011 | Yang | |
| 2011/0297987 A1 | 12/2011 | Koizumi et al. | |
| 2011/0315956 A1 | 12/2011 | Tischler et al. | |
| 2012/0025218 A1 | 2/2012 | Ito et al. | |
| 2012/0193648 A1 | 8/2012 | Donofrio et al. | |
| 2012/0299051 A1 | 11/2012 | Jeong | |
| 2012/0302124 A1 | 11/2012 | Imazu | |
| 2012/0305970 A1 | 12/2012 | Kim | |
| 2013/0032820 A1 | 2/2013 | Wirth | |
| 2013/0099661 A1 | 4/2013 | Gasse et al. | |
| 2013/0154490 A1* | 6/2013 | Harbers | H05B 45/20 315/193 |
| 2013/0329440 A1* | 12/2013 | Tsutsumi | F21S 41/663 362/465 |
| 2014/0361327 A1 | 12/2014 | Chae et al. | |

FOREIGN PATENT DOCUMENTS

| | | |
|---|---|---|
| JP | 2011-009572 A | 1/2011 |
| JP | 2013055135 | 3/2013 |
| KR | 100519592 | 9/2005 |
| KR | 10-2011-0134322 A | 12/2011 |
| KR | 1020120119350 | 10/2012 |
| KR | 1020120134375 | 12/2012 |
| KR | 1020130007666 | 1/2013 |
| KR | 2013-0030178 | 3/2013 |
| KR | 1020130028288 | 3/2013 |
| TW | 201244183 | 11/2012 |
| WO | 2011093454 A1 | 8/2011 |
| WO | 2013039344 A2 | 3/2013 |

OTHER PUBLICATIONS

Office Action in Chinese Patent Application No. 201480039941.4, dated Apr. 1, 2017.
European Patent Office, European Patent Application No. 14797634.4, Extended European Search Report, dated Oct. 21, 2016, 10 pages.
Korean Intellectual Property Office, International Search Report, International Application No. PCT/KR2014/004284, dated Aug. 22, 2014, (2 pages).
English Translation of Korean Office Action from related Korean Patent Application No. 10-2013-0094299 dated Jun. 13, 2019 (14 pages).
English Translation of Korean Office Action from related Korean Patent Application No. 10-2013-0147684 dated Oct. 16, 2019 (6 pages).

* cited by examiner

【Figure 1】
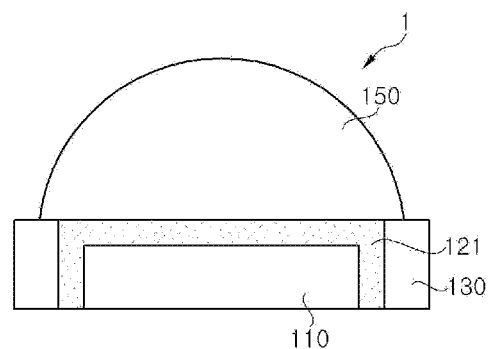
【Figure 2】
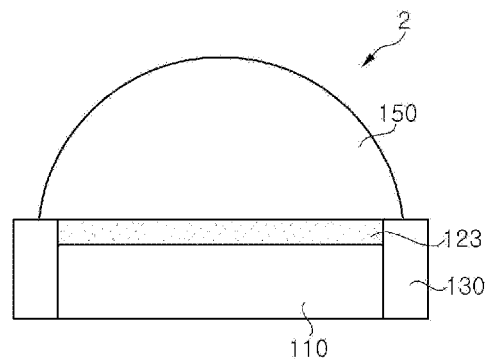
【Figure 3a】

【Figure 3b】
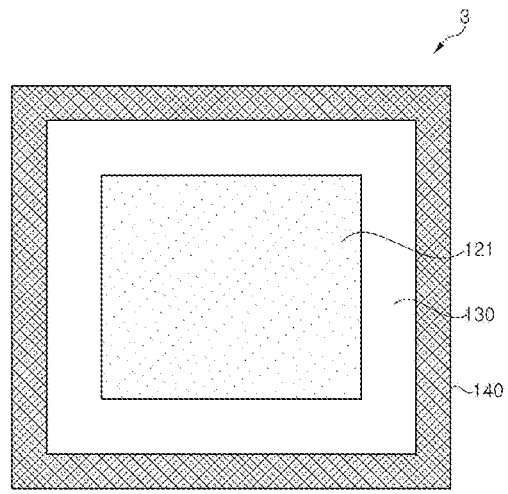
【Figure 4】
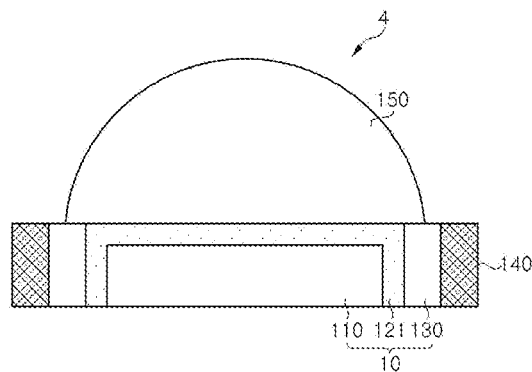
【Figure 5】
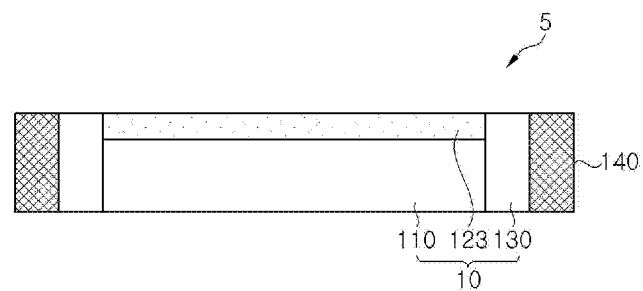

[Figure 6a]
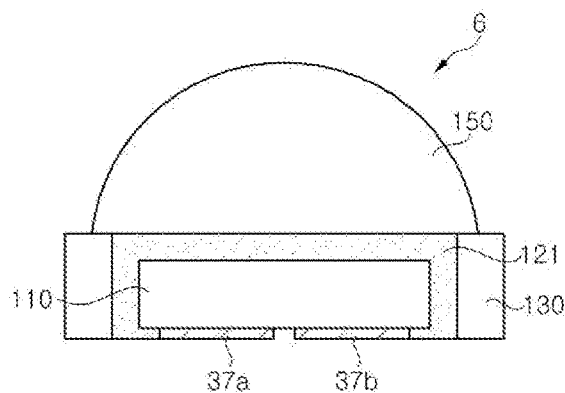
[Figure 6b]
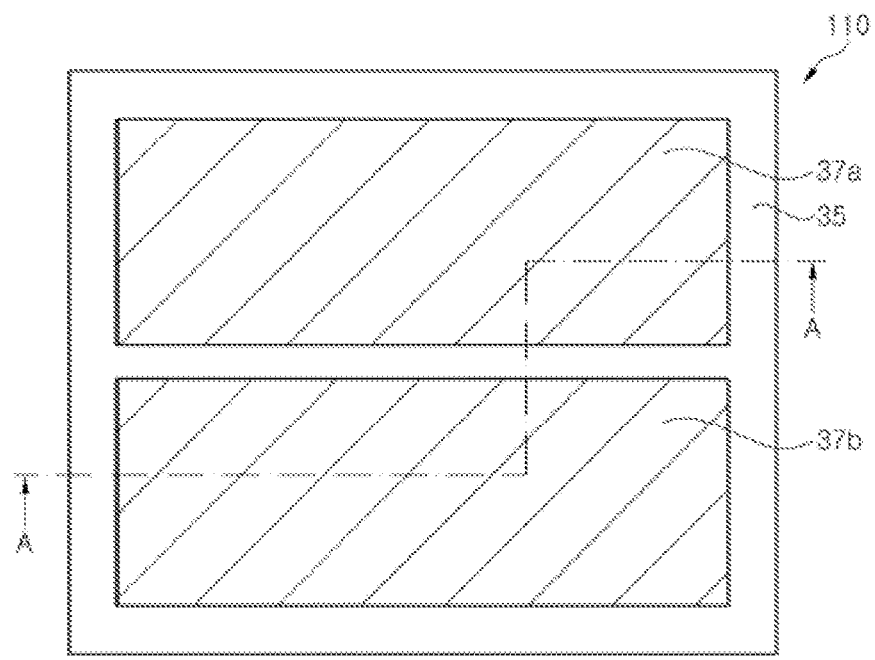
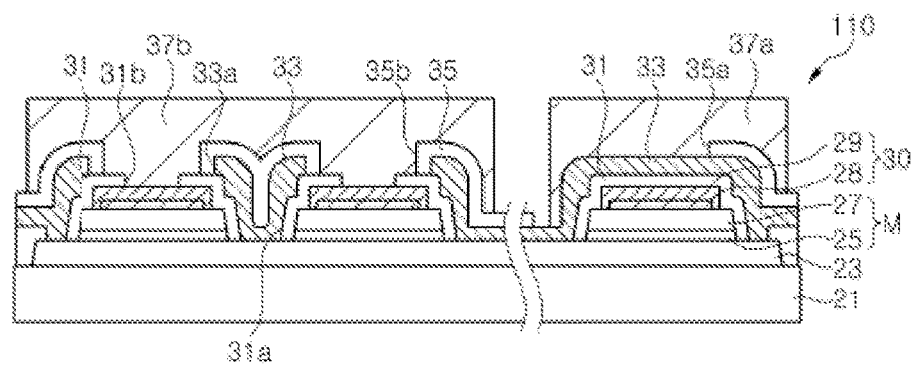

【Figure 10】
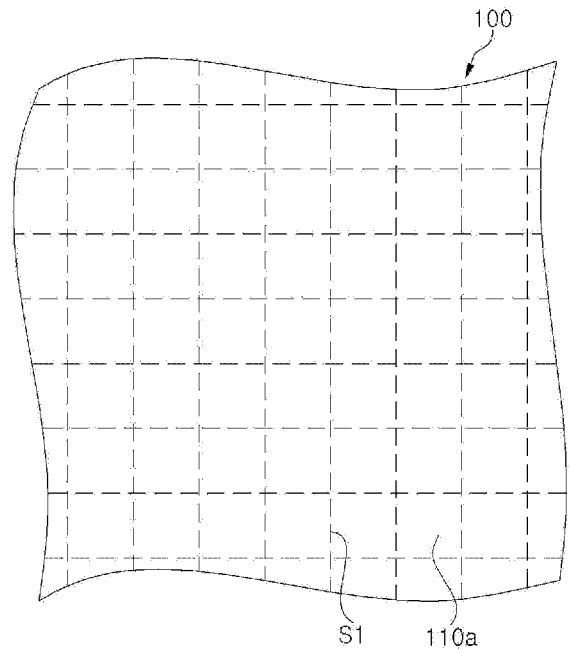
【Figure 11】
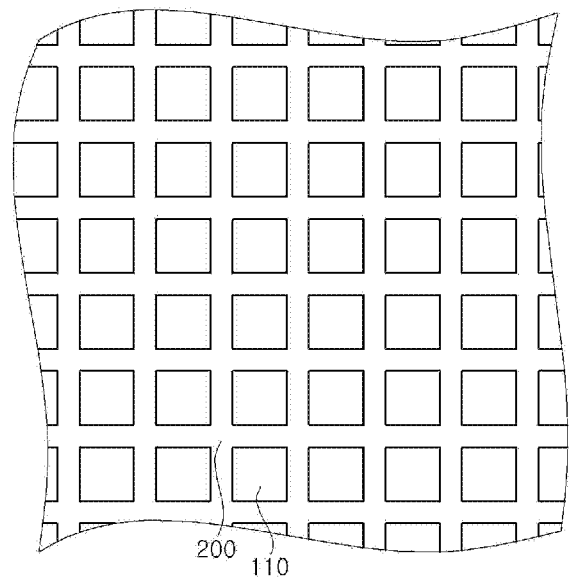

【Figure 12a】
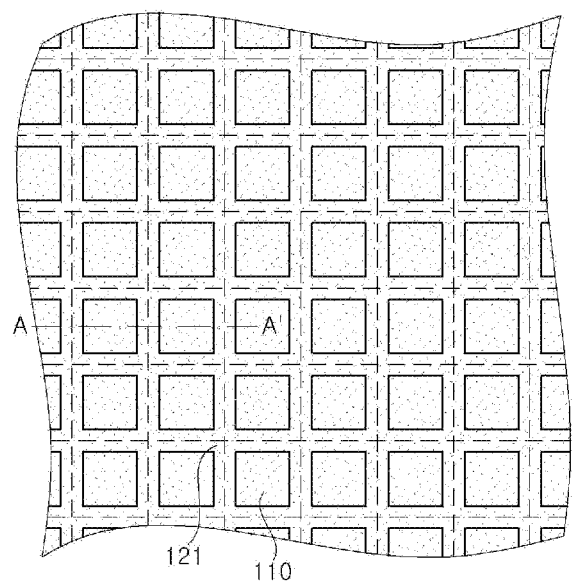
【Figure 12b】
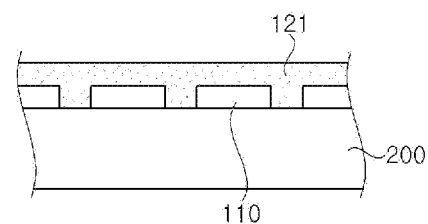

【Figure 13】
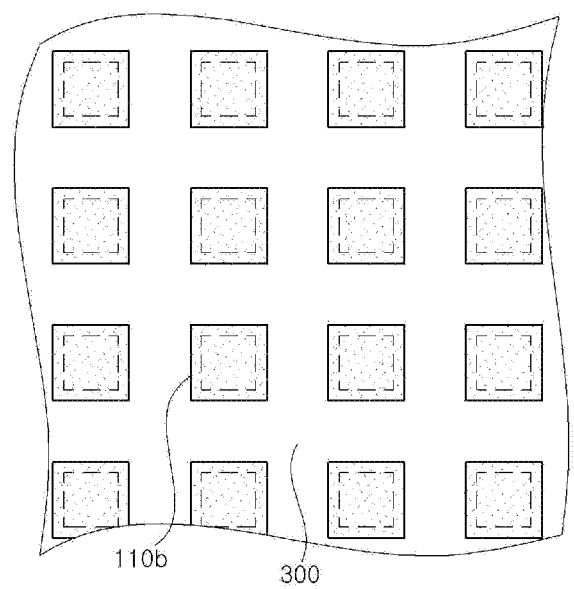
【Figure 14】
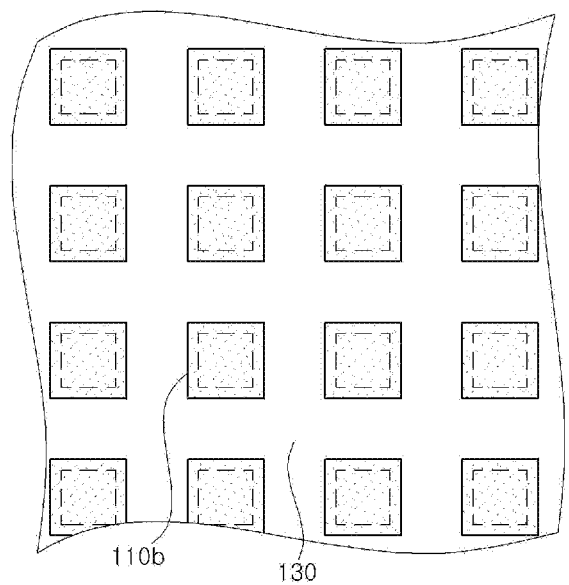

[Figure 15]
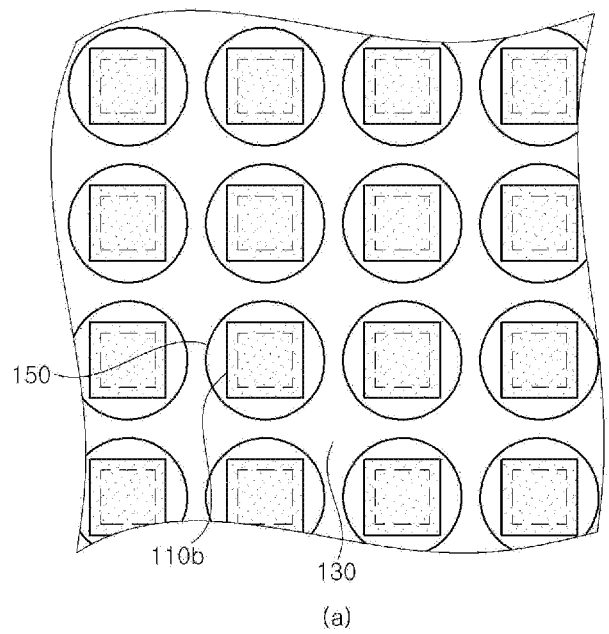
(a)
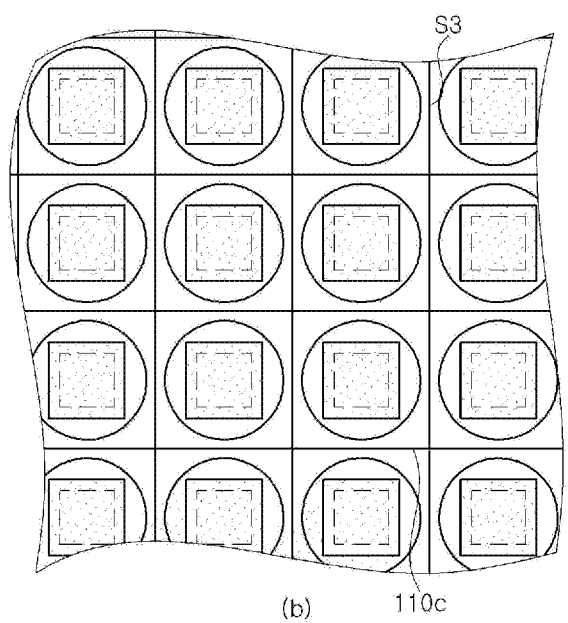
(b)

[Figure 17]
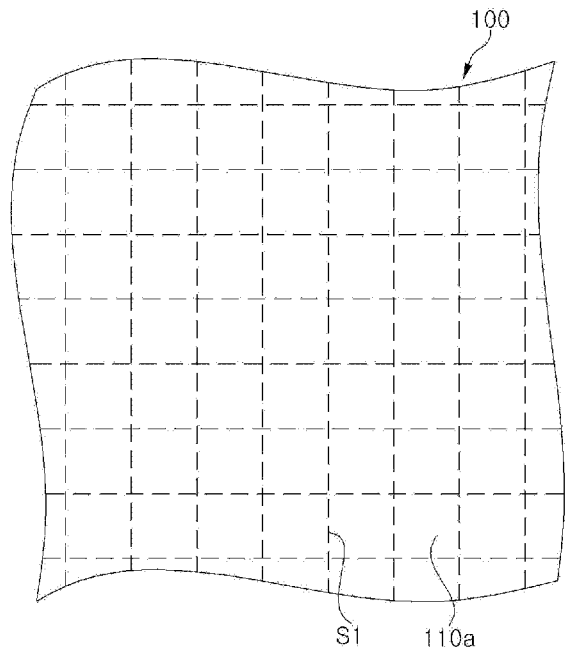
[Figure 18]
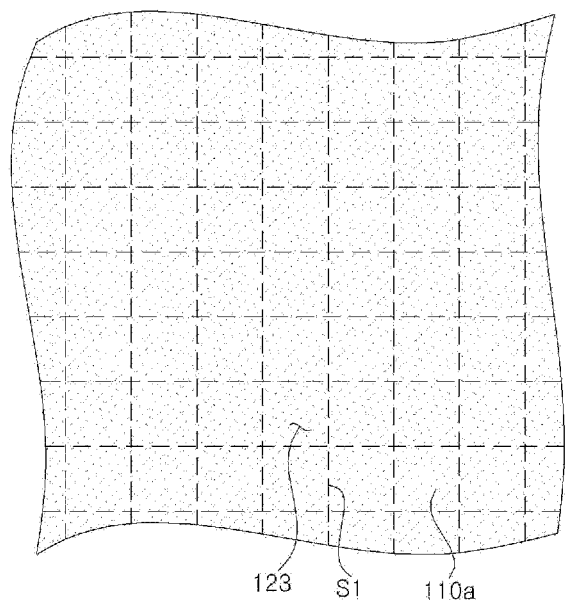

【Figure 19a】
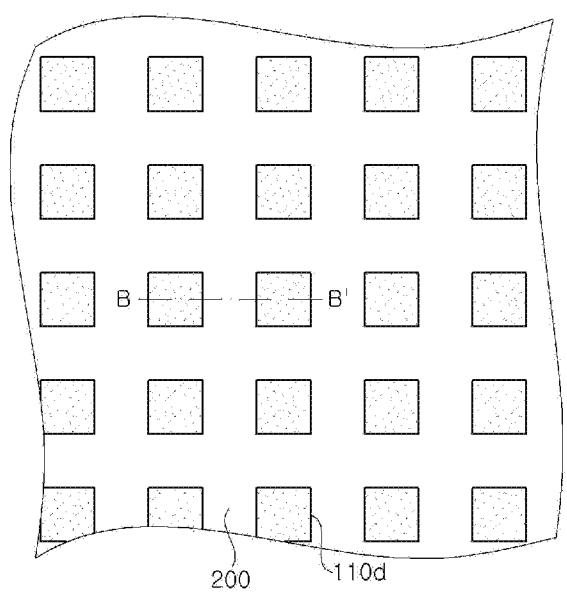
【Figure 19b】
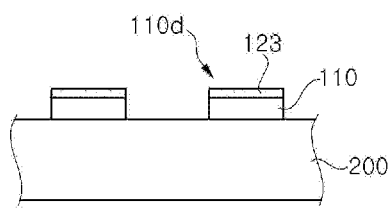

[Figure 20]
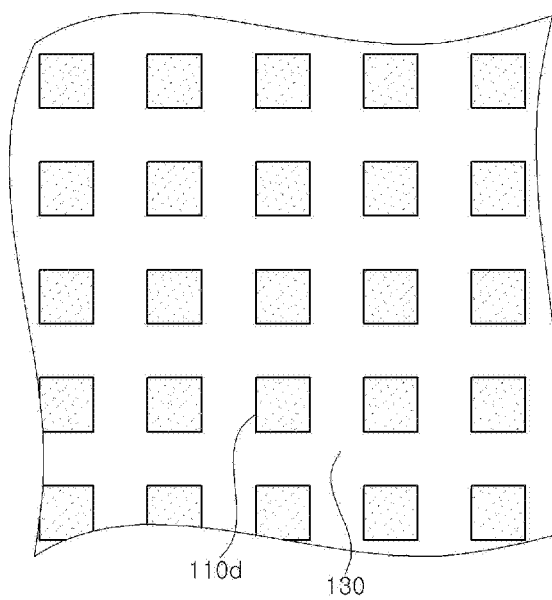
[Figure 21]
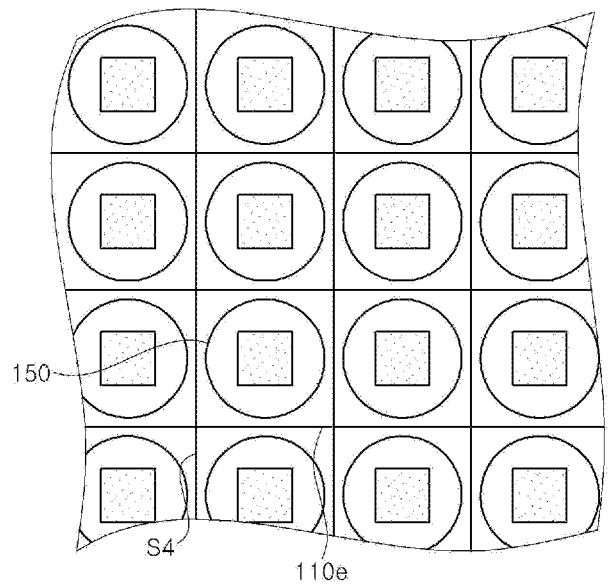

__

LIGHT-EMITTING DEVICE PACKAGE, MANUFACTURING METHOD THEREOF, AND VEHICLE LAMP AND BACKLIGHT UNIT INCLUDING SAME

CROSS REFERENCE TO RELATED APPLICATION

This patent document is a continuation of U.S. patent application Ser. No. 14/891,304 filed on Feb. 16, 2016, which is a 35 U.S.C. § 371 National Stage application of PCT Application No. PCT/KR2014/004284, filed on May 13, 2014, which further claims the benefits and priorities of Korean Patent Application No. 10-2013-0147684, filed on Nov. 29, 2013, Korean Patent Application No. 10-2013-0094299, filed on Aug. 8, 2013, and Korean Patent Application No. 10-2013-0053633, filed on May 13, 2013. The entire disclosures of the above applications are incorporated by reference herein their entireties.

TECHNICAL FIELD

The present invention relates to a light emitting device package, a manufacturing method thereof, and a vehicle lamp and a backlight unit including the same, and more particularly, to a small light emitting device package, a method of manufacturing a wafer-level light emitting device package, and a vehicle lamp and a backlight unit including the same.

BACKGROUND ART

A light emitting diode is an inorganic semiconductor device capable of emitting light through recombination of electrons and holes and is used in various fields including displays, vehicle lamps, general lighting, and the like. A light emitting diode has various merits such as long lifespan, low power consumption and rapid response, and a light emitting device package including such a light emitting diode is expected to replace conventional light sources. Due to various merits of the light emitting diode, the light emitting device package is applied to various fields, for example, a vehicle lamp and a backlight unit.

A typical light emitting device package generally includes a substrate, a light emitting chip mounted on the substrate, an encapsulation material encapsulating the light emitting chip, a housing supporting the encapsulation material, and a lens disposed on the light emitting chip. However, the typical light emitting device package requires a separate packaging process independent of a process of manufacturing a light emitting chip, thereby causing complication of the manufacturing process while increasing manufacturing costs. Moreover, since such a light emitting device package requires a substrate for mounting the light emitting chip, there is a limit in miniaturization of the package.

In order to simplify the process of manufacturing such a light emitting device package, a wafer level process is disclosed in Korean Patent Publication No. 10-2012-0119350 A and the like. Korean Patent Publication No. 10-2012-0119350 A discloses a method of manufacturing a light emitting device module, in which a light emitting device is directly mounted on a substrate and a lens surrounding the light emitting device is directly mounted on the substrate, thereby minimizing and simplifying the manufacturing process.

However, the light emitting device module disclosed in the publication requires the substrate for forming the lens. Thus, in order to manufacture a light emitting apparatus like the light emitting device module, it is necessary to provide a packaging process for mounting the light emitting device on the substrate, and the light emitting device must include a secondary substrate in addition to a growth substrate. Such a typical light emitting apparatus cannot be regarded as a wafer level package, which does not employ other substrates except the growth substrate, and has a limit in miniaturization.

In addition, when a light emitting diode is applied to a vehicle lamp and a backlight unit, a light emitting device package including such a light emitting diode can suffer from a problem of light leakage. As used herein, light leakage means leakage of light through a side surface of the light emitting device package. That is, light leakage means that light leaks through other regions of the light emitting device package such as the side surface thereof instead of illuminating a region in front of the light emitting device package.

When light leakage occurs from the light emitting device package in the vehicle lamp, a cutoff line corresponding to a border line between a bright section and a dark section generated upon illumination of a region in front of the vehicle lamp with light emitted from the vehicle lamp becomes unclear. As a result, an undesired region is illuminated upon driving of a vehicle, causing hindrance of sight of other drivers, and the light emitting device package suffers from light loss due to light leakage through the side surface thereof.

In addition, when light leakage occurs from the light emitting device package in the backlight unit, an outer periphery of a display becomes brighter than a central region thereof or spots can be generated over the display screen. In some cases, the display can suffer from deterioration in contrast ratio and reduction of viewing angle. Moreover, the display can suffer from color deviation, thereby causing deterioration of image quality.

Korean Patent No. 10-0519592 (Registration Date: Sep. 29, 2005) discloses a light emitting diode display capable of preventing light leakage. The light emitting diode display includes a light emitting diode (LED) chip and a reflector, on which a light absorption sheet and a light absorption layer are disposed to absorb light scattered at an edge of an upper surface of the reflector. This light emitting diode display prevents light leakage by guiding light emitted from the light emitting diode chip to meet a structure for prevention of light leakage after traveling through air. Thus, this light emitting diode display has a large volume and allows a limited number of light emitting diodes (LEDs) to be mounted on a printed circuit board. Moreover, a secondary substrate must be provided together with a growth substrate to a light emitting device, thereby causing a limit in miniaturization of the light emitting device.

PRIOR LITERATURE (Patent Document 1) Korean Patent Publication No. 10-2012-0119350 A
(Patent Document 2) Korean Patent No. 10-0519592

DISCLOSURE

Technical Problem

One technical object of the present invention provides methods for manufacturing an ultraminiature light emitting device package and a wafer level package not including a secondary substrate excluding a growth substrate.

Another technical aspect of the present invention provides a light emitting device package that can prevent light leakage and lateral light leakage.

Another technical object of the present invention provides a vehicle lamp that can emit light providing a clear cutoff line.

Another technical object of the present invention provides a backlight unit that can improve image quality of a display by solving a problem of color deviation, and can improve contrast ratio and viewing angle of the display.

Technical Solution

In accordance with one exemplary embodiment of the present invention, a light emitting device package includes: a light emitting chip including electrode pads disposed on a lower side thereof; a wavelength conversion unit covering at least upper and side surfaces of the light emitting chip; and a reflective unit covering the side surface of the light emitting chip, wherein the light emitting chip includes a second conductivity-type semiconductor layer, an active layer disposed on the second conductivity-type semiconductor layer, a first conductivity-type semiconductor layer disposed on the active layer, and a substrate disposed on the first conductivity-type semiconductor layer.

According to the present invention, the light emitting device package does not include a separate secondary substrate and thus can be miniaturized.

The wavelength conversion unit may be interposed between the side surface of the light emitting chip and the reflective unit.

An upper surface of the wavelength conversion unit may have the same height as an upper surface of the reflective unit.

The wavelength conversion unit may include a phosphor and a resin, and may include a side surface subjected to plasma treatment.

The light emitting chip may include a plurality of mesas separated from each other on the first conductivity-type semiconductor layer and each including the active layer and the second conductivity-type semiconductor layer; reflective electrodes disposed on the plurality of mesas, respectively, and forming ohmic contact with the second conductivity-type semiconductor layer; and a current spreading layer covering the plurality of mesas and the first conductivity-type semiconductor layer and including openings respectively disposed within upper regions of the mesas and exposing the reflective electrodes, the current spreading layer forming ohmic contact with the first conductivity-type semiconductor layer while being insulated from the plurality of mesas.

The plurality of mesas may have an elongated shape and extend parallel to each other in one direction, and the openings of the current spreading layer may be disposed biased to the same ends of the plurality of mesas.

The electrode pads may include a first pad and a second pad; the light emitting chip may further include an upper insulation layer covering at least a portion of the current spreading layer and including openings exposing the reflective electrodes; the first pad may be electrically connected to the current spreading layer; and the second pad may be electrically connected to the reflective electrodes exposed through the openings.

The light emitting device package may further include a lens disposed on the light emitting chip.

The light emitting device package may further include a light blocking unit at least partially covering a side surface of the reflective unit.

In accordance with another exemplary embodiment of the present invention, a light emitting device package includes: a unit light emitting device; and a light blocking unit covering at least one side surface of the unit light emitting device, wherein the unit light emitting device includes a light emitting chip having an upper surface, a side surface and a lower surface; a wavelength conversion unit covering the upper surface of the light emitting chip; and a reflective unit covering the side surface of the light emitting chip, and the light emitting chip includes electrode pads disposed on the lower surface thereof and exposed outside.

The light blocking unit may block light emitted to a side surface of the reflective unit, thereby preventing light leakage of the light emitting device.

The light emitting device package may further include a wavelength conversion unit covering the side surface of the light emitting chip, and the wavelength conversion unit covering the side surface of the light emitting chip may be disposed between the reflective unit and the light emitting chip.

The wavelength conversion unit may include a phosphor and a resin, and may include a side surface subjected to plasma treatment.

The light blocking unit includes a light absorption material capable of absorbing light better than the reflective unit, and the light absorption material may include carbon black, a black resin, and a black paint.

An upper surface of the light blocking unit may have the same height as or a higher height than an upper surface of the reflective unit.

The light emitting device package may further include at least one unit light emitting device and the light blocking unit may cover at least one side surface of the at least one unit light emitting device.

At least one side surface of one unit light emitting device may adjoin at least one side surface of another unit light emitting device.

A portion of the light blocking unit may be disposed between the unit light emitting device and the at least one unit light emitting device.

The at least one unit light emitting device may further include a wavelength conversion unit covering a side surface of the light emitting chip, and the wavelength conversion unit covering the side surface may be disposed between the reflective unit of the at least one unit light emitting device and the light emitting chip.

An upper surface of the wavelength conversion unit may have the same height as an upper surface of the reflective unit.

An upper surface of the reflective unit may have the same height as an upper surface of the light blocking unit.

The light emitting device package may further include a lens disposed on the light emitting chip.

In accordance with a further exemplary embodiment of the present invention, a vehicle lamp includes the light emitting device package as set forth above.

In accordance with yet another exemplary embodiment of the present invention, a backlight unit includes a printed circuit board; the light emitting device package according to exemplary embodiments as set forth above; and a lens mounted on the printed circuit board and covering the light emitting device.

At least a portion of the light blocking unit of the light emitting device package may be disposed between a bottom of the lens and the printed circuit board.

In accordance with yet another exemplary embodiment of the present invention, a method for manufacturing a light emitting device package includes: arranging light emitting chips on a first support substrate to be separated from each other, each of the light emitting chips including electrode patterns disposed on a lower surface thereof; forming a wavelength conversion unit covering an upper surface and a side surface of each of the light emitting chips; and forming a reflective unit covering the side surface of each of the light emitting chips.

The light emitting chips separated from each other may be obtained by dividing the same wafer.

The wavelength conversion unit may be formed to fill a region between the light emitting chips, and the manufacturing method may further include dividing the wavelength conversion unit in the region between the light emitting chips into first individual light emitting device units after forming the wavelength conversion unit.

The manufacturing method may further include arranging the individual light emitting device units on a second support substrate to be separated from each other after dividing the wavelength conversion unit into the individual light emitting device units.

The reflective unit may be formed to fill a region between the first individual light emitting device units.

The manufacturing method may further include dividing the reflective unit in the region between the first individual light emitting device units into second individual light emitting device units after forming the reflective unit.

The manufacturing method may further include performing planarization with respect to at least one of an upper surface of the reflective unit and an upper surface of the wavelength conversion unit.

The manufacturing method may further include performing plasma treatment with respect to a side surface of the wavelength conversion unit before forming the reflective unit.

The manufacturing method may further include forming a lens on each of the light emitting chips.

In accordance with yet another exemplary embodiment of the present invention, a method for manufacturing a light emitting device package includes: preparing a wafer including a plurality of semiconductor stack structures and electrode patterns disposed on a lower surface thereof; forming a wavelength conversion unit covering an upper surface of the wafer; dividing the wafer to form light emitting chips each having the wavelength conversion unit at an upper portion thereof; arranging the light emitting chips on a support substrate to be separated from each other; and forming a reflective unit covering side surfaces of the light emitting chips and a side surface of the wavelength conversion unit.

Advantageous Effects

According to the present invention, it is possible to provide a miniaturized light emitting device package, which includes a light emitting chip, a wavelength conversion unit and a reflective unit that are closely formed to one another and does not include a separate secondary substrate or a separate lead electrode.

In addition, according to the present invention, it is possible to provide a method for manufacturing a light emitting device package, which can form a wavelength conversion unit and a reflective unit to be integrally formed with plurality of light emitting chip at a wafer level, and can eliminate a separate packaging process. As a result, the method for manufacturing a light emitting device package can be simplified.

Further, it is possible to provide a miniaturized light emitting device package, which includes a light emitting chip, a wavelength conversion unit, a reflective unit and a light blocking unit that are closely formed to one another and does not include a separate secondary substrate or a separate lead electrode.

Furthermore, the light emitting device package adopts a light blocking unit, thereby preventing light leakage of the light emitting device package. Thus, a vehicle lamp adopting the light emitting device package can be operated to illuminate a region intended by a user. That is, it is possible to provide light forming a clear border between a bright section and a dark section. As a result, it is possible to improve driver visibility while protecting sight of other drivers. Furthermore, a backlight unit including the light emitting device package according to the exemplary embodiments can maximize intensity of light entering the lens, thereby improving contrast ratio and viewing angle of a display. Furthermore, the backlight unit including the light emitting device package according to the exemplary embodiments can solve a problem of color deviation of a display, thereby improving image quality.

DESCRIPTION OF DRAWINGS

FIG. 1 is a sectional view of a light emitting device package according to one exemplary embodiment.

FIG. 2 is a sectional view of a light emitting device package according to another exemplary embodiment.

FIG. 3a and FIG. 3b are a sectional view and a plan view of a light emitting device package according to a further exemplary embodiment.

FIG. 4 is a sectional view of a light emitting device package according to yet another exemplary embodiment.

FIG. 5 is a sectional view of a light emitting device package according to yet another exemplary embodiment.

FIG. 6a and FIG. 6b are a sectional view and a plan view of a light emitting device package and a light emitting chip according to yet another exemplary embodiment.

FIG. 10 to FIG. 15 are plan views and a sectional view illustrating a method for manufacturing a light emitting device package according to one exemplary embodiment.

FIG. 17 to FIG. 21 are plan views and a sectional view illustrating a method for manufacturing a light emitting device package according to a further exemplary embodiment.

BEST MODE

Figure 7A:
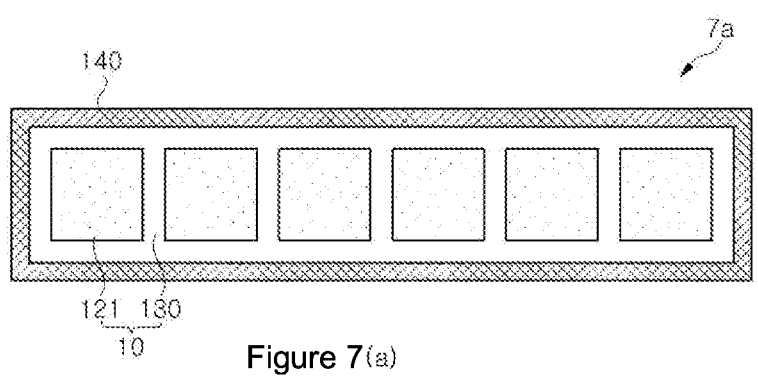
FIG. 7a and FIG. 7b show plan views of light emitting device packages according to yet another exemplary embodiment.

Hereinafter, exemplary embodiments of the present disclosure will be described in detail with reference to the accompanying drawings. The following embodiments are provided by way of example so as to fully convey the spirit of the present disclosure to those skilled in the art to which the present disclosure pertains. Accordingly, the present disclosure is not limited to the embodiments disclosed herein and can also be implemented in different forms. In the drawings, widths, lengths, thicknesses, and the like of elements can be exaggerated for clarity and descriptive purposes. When an element or layer is referred to as being "disposed above" or "disposed on" another element or layer, it can be "directly disposed above" or "directly disposed on" the other element or layer or intervening elements or layers can be present. Throughout the specification, like reference numerals denote like elements having the same or similar functions.

FIG. 1 is a sectional view of a light emitting device package 1 according to one exemplary embodiment.

Referring to FIG. 1, the light emitting device package 1 includes a light emitting chip 110, a wavelength conversion unit 121, and a reflective unit 130. The light emitting device package 1 may further include a lens 150.

The light emitting chip 110 includes an upper surface, a lower surface, and particularly, electrode pads (not shown) disposed on the lower surface thereof. With the structure wherein the light emitting chip 110 includes the electrode pads on the lower surface thereof, the light emitting device package 1 does not need a separate electrode and the electrode pads can act as electrodes of the light emitting device package 1. With this structure, the light emitting device package 1 can be miniaturized.

The light emitting chip 110 includes the electrode pads on the lower surface thereof, and may include any type of light emitting diode, for example, a flip-chip type light emitting diode.

The wavelength conversion unit 121 may cover the upper surface of the light emitting chip 110 and may further cover a side surface of the light emitting chip 110. The wavelength conversion unit 121 may have a constant thickness, or may be formed such that an upper surface of the wavelength conversion unit 121 has a different thickness than a side surface thereof. It is possible to adjust color characteristics of light emitted from the light emitting device package 1 through adjustment of the thickness of the wavelength conversion unit 121.

The wavelength conversion unit 121 may include a phosphor and a resin, in which the phosphor may be mixed with the resin to be randomly or evenly dispersed in the resin. The phosphors included in the wavelength conversion unit 121 can convert light emitted from the light emitting chip 110 into light having different wavelengths than the light from the light emitting chip 110. Accordingly, the light emitting device package 1 can emit various colors and it is possible to realize a white light emitting device.

The resin may include a polymer resin such as an epoxy resin or an acryl resin, or a silicone resin, and may act as a matrix for dispersing the phosphor therein.

The phosphor can convert light emitted from the light emitting chip 110 into light having different wavelengths therefrom through excitation of the light. The phosphor may include various phosphors known to a person having ordinary knowledge in the art, and may include at least one among, for example, garnet phosphors, aluminate phosphors, sulfide phosphors, oxynitride phosphors, nitride phosphors, fluoride phosphors, and silicate phosphors. However, it should be understood that the present disclosure is not limited thereto.

On the other hand, characteristics of the light converted by the wavelength conversion unit 121 can be freely regulated by adjusting the phosphor included in the wavelength conversion unit 121, the thickness of the wavelength conversion unit 121, the resin in the wavelength conversion unit 121, and the like.

The reflective unit 130 may cover the side surface of the light emitting chip 110 and may further cover the wavelength conversion unit 121 formed on the side surface of the light emitting chip 110. Thus, the wavelength conversion unit 121 covering the side surface of the light emitting chip 110 may be interposed between the light emitting chip 110 and the reflective unit 130.

The reflective unit 130 serves to reflect light. With the structure wherein the reflective unit 130 is formed on the outer peripheral side surface of the light emitting device package 1, the light emitting device package 1 allows light emitted through the light emitting chip 110 and the phosphor to be collected above the light emitting chip. However, it should be understood that the present disclosure is not limited thereto, and a directional angle of the light emitted from the light emitting chip 110 can be regulated by adjusting reflectivity and light transmittance of the reflective unit 130, as needed.

The reflective unit 130 may include a resin and may further include fillers capable of reflecting or scattering light.

The resin may be a transparent or translucent resin, and may include a silicone resin, or a polymer resin such as an epoxy resin, a polyimide resin, a urethane resin, and the like. In this exemplary embodiment, the resin may be a silicone resin.

The fillers may be uniformly dispersed in the resin. The fillers may be selected from any materials capable of reflecting or scattering light, and may include, for example, titanium dioxide ($TiO_2$), silicon dioxide ($SiO_2$), zirconium dioxide ($ZrO_2$), and the like. The reflective unit 130 may include at least one of the above fillers. Reflectivity or a degree of light scattering of the reflective unit 130 can be regulated by adjusting the kind or concentration of fillers.

An upper surface of the reflective unit 130 may have the same height as an upper surface of the wavelength conversion unit 121. That is, as shown in the drawings, the upper surface of the reflective unit 130 may be flush with the upper surface of the wavelength conversion unit 121. With this structure, the lens 150 can be more stably disposed on the light emitting chip 110.

Further, the wavelength conversion unit 121 may have a side surface subjected to plasma treatment. Accordingly, bonding strength between the wavelength conversion unit 121 and the reflective unit 130 increases, thereby improving stability and reliability of the light emitting device package 1.

The lens 150 may be disposed on the light emitting chip 110. Further, a lower surface of the lens 150 has a larger area than the upper surface of the wavelength conversion unit 121, whereby the lens 150 can cover the entirety of the upper surface of the wavelength conversion unit 121. With this structure, the lens 150 allows the light converted by the wavelength conversion unit 121 to be more effectively emitted to the outside therethrough.

The lens 150 may be a silicone resin and may be formed of any material without limitation. The lens 150 may have a semi-spherical shape as shown in the drawings, or may have other shapes such as a planar shape and a shape with a concave portion at a center thereof in order to obtain a desired orientation pattern of light.

On the other hand, the lens 150 may be omitted in order to reduce the overall height of the light emitting device package 1.

As described above, the light emitting device package 1 does not include a separate secondary substrate or a separate lead electrode and includes the light emitting chip 110, the wavelength conversion unit 121 and the reflective unit 130 that are closely formed to one another, thereby achieving miniaturization.

FIG. 2 is a sectional view of a light emitting device package according to another exemplary embodiment.

A light emitting device package 2 shown in FIG. 2 is generally similar to the light emitting device package 1 described with reference to FIG. 1 except that the wavelength conversion unit 123 is not formed on the side surface of the light emitting chip 110. In the following descriptions, the different features of the light emitting device package 2 shown in FIG. 2 are mainly discussed.

Referring to FIG. 2, the light emitting device package 2 includes a light emitting chip 110, a wavelength conversion unit 123, and a reflective unit 130. The light emitting device package 2 may further include a lens 150.

The wavelength conversion unit 123 may have a flat bar shape and may cover an upper surface of the light emitting chip 110. Accordingly, the wavelength conversion unit 123 is not formed on a side surface of the light emitting chip 110, and the reflective unit 130 may directly cover the side surface of the light emitting chip 110 and may further cover a side surface of the wavelength conversion unit 123. Furthermore, as shown in FIG. 2, the side surface of the wavelength conversion unit 123 may be coplanar to the side surface of the light emitting chip 110.

In the light emitting device package 2, the light emitting chip 110, the reflective unit 130 and the lens 150 are similar to those of the light emitting device package described with reference to FIG. 1, and thus detailed descriptions thereof will be omitted.

FIG. 3*a* and FIG. 3*b* are a sectional view and a plan view of a light emitting device package according to a further exemplary embodiment.

Referring to FIG. 3*a* and FIG. 3*b*, a light emitting device package 3 includes a unit light emitting device 10 and a light blocking unit 140. The unit light emitting device 10 includes a light emitting chip 110, a wavelength conversion unit 121, and a reflective unit 130.

The light emitting chip 110 includes an upper surface, a side surface, a lower surface, and particularly, electrode pads (not shown) disposed on the lower surface. With the structure wherein the light emitting chip 110 includes the electrode pads disposed on the lower surface thereof, the light emitting device package 3 does not need a separate electrode and the electrode pads can act as electrodes of the light emitting device package 3. With this structure, the light emitting device package 3 can be miniaturized.

The light emitting chip 110 includes the electrode pads disposed on the lower surface thereof, and may include any type of light emitting diode, for example, a flip-chip type light emitting diode.

The wavelength conversion unit 121 may cover the upper surface of the light emitting chip 110 and may further cover the side surface of the light emitting chip 110. The wavelength conversion unit 121 may have a constant thickness, or may be formed such that an upper surface of the wavelength conversion unit 121 has a different thickness than a side surface thereof. Further, the side surfaces of the wavelength conversion unit may differ from each other depending upon the shape or pattern of the light emitting chip 110. It is possible to adjust color characteristics of light emitted from the light emitting device package through adjustment of the thickness and the kind of material of the wavelength conversion unit 121.

The wavelength conversion unit 121 may include a phosphor and a resin, in which the phosphor may be mixed with the resin to be randomly or evenly dispersed in the resin. The phosphors included in the wavelength conversion unit 121 can convert light emitted from the light emitting chip 110 into light having different wavelengths than the light from the light emitting chip 110. Accordingly, it is possible to realize various unit light emitting devices 10 emitting various colors, for example, an amber-based unit light emitting device 10, a red color-based unit light emitting device 10, a green color-based unit light emitting device 10 and a white color-based unit light emitting device 10.

The resin may include a polymer resin such as an epoxy resin or an acryl resin, or a silicone resin, and may act as a matrix for dispersing the phosphor therein.

The phosphor can convert light emitted from the light emitting chip 110 into light having different wavelengths therefrom through excitation of the light. The phosphor may include various phosphors known to a person having ordinary knowledge in the art, and may include at least one among, for example, garnet phosphors, aluminate phosphors, sulfide phosphors, oxynitride phosphors, nitride phosphors, fluoride phosphors, and silicate phosphors. However, it should be understood that the present disclosure is not limited thereto.

The wavelength conversion unit 121 may be formed by depositing a mixture of the phosphor and the resin so as to cover side surfaces and upper surfaces of the light emitting chips 110 by printing, dispensing, spraying or the like, followed by curing. However, it should be understood that the present invention is not limited thereto and the wavelength conversion unit 121 may be formed by various methods without departing from the scope of the present invention.

On the other hand, characteristics of the light converted by the wavelength conversion unit 121 can be freely regulated by adjusting the phosphor included in the wavelength conversion unit 121, the thickness of the wavelength conversion unit 121, the resin in the wavelength conversion unit 121, and the like.

The reflective unit 130 may cover the side surface of the light emitting chip 110 and may further cover the wavelength conversion unit 121 formed on the side surface of the light emitting chip 110. Thus, the wavelength conversion unit 121 covering the side surface of the light emitting chip 110 may be interposed between the light emitting chip 110 and the reflective unit 130.

The reflective unit 130 serves to reflect light. With the structure wherein the reflective unit 130 is formed on the outer peripheral side surface of the light emitting device package 1, the light emitting device package allows light emitted through the light emitting chip 110 and the phosphor to be collected above the unit light emitting device 10. However, it should be understood that the present invention is not limited thereto, and a directional angle of the light emitted from the light emitting chip 110 can be regulated by adjusting reflectivity and light transmittance of the reflective unit 130, as needed.

The reflective unit 130 may include a resin and may further include fillers capable of reflecting or scattering light.

The resin may be a transparent or translucent resin, and may include a silicone resin, or a polymer resin such as an epoxy resin, a polyimide resin, a urethane resin, and the like. In this exemplary embodiment, the resin may be a silicone resin.

The fillers may be uniformly dispersed in the resin. The fillers may be selected from any materials capable of reflecting or scattering light, and may include, for example, titanium dioxide ($TiO_2$), silicon dioxide ($SiO_2$), zirconium dioxide ($ZrO_2$), and the like. The reflective unit 130 may include at least one of the above fillers. Reflectivity or a degree of light scattering of the reflective unit 130 can be regulated by adjusting the kind or concentration of fillers.

The reflective unit 130 may have a constant thickness. The reflective unit 130 may have different thicknesses depending upon the location of the reflective unit 130 in the light emitting device package.

An upper surface of the reflective unit 130 may have the same height as an upper surface of the wavelength conversion unit 121. That is, as shown in the drawings, the upper surface of the reflective unit 130 may be flush with the upper surface of the wavelength conversion unit 121. With this structure, the lens (not shown) can be more stably disposed on the light emitting chip 110.

The reflective unit 130 may be formed in a similar manner as in formation of the wavelength conversion unit 121, and, after formation of the reflective unit 130, at least one of the upper surfaces of the reflective unit 130 and the wavelength conversion unit 121 may be subjected to planarization. Planarization may be performed by grinding, cutting, and the like. When the reflective unit 130 is formed by deposition, the reflective unit 130 may be formed on the wavelength conversion unit 121 due to conditions of the manufacturing process. Then, the reflective unit 130 formed on the wavelength conversion unit 121 can be removed by planarization, and thus can be prevented from being disposed on the light emitting chip 110 in the light emitting device package 3.

Further, the wavelength conversion unit 121 may have a side surface subjected to plasma treatment. Accordingly, bonding strength between the wavelength conversion unit 121 and the reflective unit 130 increases, thereby improving stability and reliability of the light emitting device package 3.

The unit light emitting device 10 is formed by combination of the light emitting chip 110, the wavelength conversion unit 121 and the reflective unit 130 described above.

The light blocking unit 140 may cover at least one side surface of the unit light emitting device 10. That is, the light blocking unit 140 may cover at least one side surface of the reflective unit 130 included in the unit light emitting device 10. The light blocking unit 140 and the reflective unit 130 may contact each other. With this structure, the light blocking unit 140 may be disposed at the outermost periphery of the light emitting device 10.

The light blocking unit 140 may serve to absorb light. With the structure wherein the light blocking unit 140 is formed on the outer peripheral side surface of the light emitting device 10, the light emitting device package can prevent light leakage from the reflective unit 130 to the side surface of the light emitting device 10. Specifically, when light emitted from the light emitting chip 110 leaks to the side surface of the light emitting device 10 through the reflective unit 130, the light blocking unit 140 can block or absorb the light leaked through the side surface of the unit light emitting device 10.

The light blocking unit 140 may be formed of a material having high absorptivity of light. The light blocking unit 140 may be formed of a material having higher absorptivity of light than the reflective unit 130. For example, the light blocking unit 140 may be formed of a black material having high absorptivity of light. As the material for the light blocking unit 140, any material may be used so long as the material has high absorptivity of light and, for example, the light blocking unit 140 may include a light absorption material, such as carbon black, a black resin, and a black paint.

The light blocking unit 140 may have a constant thickness. The light blocking unit 140 may have different thicknesses depending upon the location of the light blocking unit 140 in the light emitting device package. The thickness of the light blocking unit 140 is not particularly limited and may be suitably adjusted depending upon intensity of light emitted through the side surface of the unit light emitting device 10. Accordingly, the thickness of the light blocking unit 140 may increase with increasing intensity of light emitted through the side surface of the reflective unit 130. It should be understood that the thickness of the light blocking unit 140 may differ depending upon the material thereof.

An upper surface of the light blocking unit 140 may have the same height as the upper surface of the reflective unit 130, or may have a higher height than the upper surface of the reflective unit 130. The height of the light blocking unit 140 is not limited thereto and may be suitably adjusted by taking into account the intensity of light emitted through the side surface of the reflective unit 130.

According to materials in the light blocking unit, the light blocking unit 140 may be formed in a similar manner as in formation of the reflective unit 130 and the wavelength conversion unit 121, or may be formed by other methods such as deposition and film coating. However, it should be understood that the present invention is not limited thereto and the light blocking unit 140 may be formed by various methods without departing from the scope of the present invention. The upper surface of the light blocking unit 140 may also be subjected to the above-described planarization.

FIG. 4 is a sectional view of a light emitting device package according to yet another exemplary embodiment.

A light emitting device package 4 shown in FIG. 4 is generally similar to the light emitting device package 3 described with reference to FIG. 3a and FIG. 3b except that a lens 150 is disposed on the light emitting chip 110. In the following descriptions, the different features of the light emitting device package shown in FIG. 4 will be mainly discussed.

A lower surface of the lens 150 may be larger than an upper surface of the wavelength conversion unit 121 such that the lens 150 can cover the entirety of the upper surface of the wavelength conversion unit 121. With this structure, the light emitting device package allow light subjected to wavelength conversion through the wavelength conversion unit 121 to be more effectively discharged to the outside.

The lens 150 may be a silicone resin and may be formed of any material without limitation. In addition, the lens 150 may have a semi-spherical shape, as shown in the drawings, or may have other shapes such as a planar shape and a shape with a concave portion at a center thereof in order to obtain a desired orientation pattern of light.

The lens 150 may be formed by molding or by various other methods.

The lens 150 may be omitted in order to reduce the overall height of the light emitting device package.

As described above, the light emitting device package 4 is formed without including a separate secondary substrate or a separate lead electrode, and thus can be miniaturized. In addition, the side surface of the unit light emitting device 4 is covered by the light blocking unit 140, thereby preventing light leakage from the light emitting device package 4.

FIG. 5 is a sectional view of a light emitting device package according to yet another exemplary embodiment.

A light emitting device package 5 shown in FIG. 5 is generally similar to the light emitting device package 3 described with reference to FIG. 3a and FIG. 3b except that a wavelength conversion unit 123 is not formed on the side surface of the light emitting chip 110. In the following descriptions, the different features of the light emitting device package 5 as shown in FIG. 5 will be mainly discussed.

Referring to FIG. 5, the light emitting device package 5 includes the light emitting chip 110, the wavelength conversion unit 123, a reflective unit 130, and a light blocking unit 140.

The wavelength conversion unit 123 may have a flat bar shape and may cover an upper surface of the light emitting chip 110. Accordingly, the wavelength conversion unit 123 is not formed on a side surface of the light emitting chip 110, and the reflective unit 130 may directly cover the side surface of the light emitting chip 110 while further covering a side surface of the wavelength conversion unit 123. Furthermore, as shown in FIG. 5, the side surface of the wavelength conversion unit 123 may be coplanar to the side surface of the light emitting chip 110.

In the light emitting device package 5, the light emitting chip 110, the reflective unit 130 and the light blocking unit 140 are similar to those of the light emitting device package described with reference to FIG. 3a and FIG. 3b, and thus detailed descriptions thereof will be omitted.

FIG. 6a and FIG. 6b are a sectional view and a plan view of a light emitting device package and a light emitting chip according to yet another exemplary embodiment, respectively.

Although a light emitting device package 6 shown in FIG. 6a is generally similar to the light emitting device package 1 described with reference to FIG. 1, the structure of the light emitting chip 110 according to this exemplary embodiment will be described in more detail with reference to FIG. 6b.

Next, one example of the light emitting chip 110 will be described in more detail with reference to FIG. 6b.

The light emitting chip 110 includes a substrate 21, a first conductivity-type semiconductor layer 23, mesas M, reflective electrodes 30, a current spreading layer 33, a lower insulation layer 31, an upper insulation layer 35, a first pad 37a, and a second pad 37b.

The substrate 21 may be a growth substrate for growth of gallium nitride-based epitaxial layers, and may be, for example, a sapphire substrate, a silicon carbide substrate, a silicon substrate, or a gallium nitride substrate. The substrate 21 may include a first plane and a second plane facing each other. In this exemplary embodiment, the first plane may correspond to a lower surface of the substrate 21, that is, a surface on which the first conductivity-type semiconductor layer 23 is formed, and the second plane may correspond to an upper surface of the substrate 21.

The first conductivity-type semiconductor layer 23 is continuously formed and includes a plurality of mesas M formed thereon to be separated from each other. Each of the mesas M includes an active layer 25 and a second conductivity-type semiconductor layer 27 and has an elongated shape extending in one direction. Herein, the mesas M have a stack structure of gallium nitride-based compound semiconductors. As shown in FIG. 1, the mesas M may be defined within an upper region of the first conductivity-type semiconductor layer 23. Alternatively, as shown in FIG. 6, the mesas M may extend to an edge of an upper surface of the first conductivity-type semiconductor layer 23 in one direction to divide the upper surface of the first conductivity-type semiconductor layer 23 into a plurality of regions. With this structure, the light emitting chip can relieve current crowding near corners of the mesas M. thereby further improving current spreading performance.

The reflective electrodes 30 are respectively disposed on the plurality of mesas M to form ohmic contact with a second conductivity-type semiconductor layer 27. The reflective electrodes 30 may include a reflective layer 28 and a barrier layer 29, which may cover an upper surface and a side surface of the reflective layer 28.

The current spreading layer 33 covers the plurality of mesas M and the first conductivity-type semiconductor layer 23. The current spreading layer 33 may have openings 33a each placed within an upper region of each of the mesas M and exposing the reflective electrodes 30. The current spreading layer 33 also forms ohmic contact with the first conductivity-type semiconductor layer 23 and is insulated from the plurality of mesas M. The current spreading layer 33 may include a reflective material such as Al.

The current spreading layer 33 may be insulated from the plurality of mesas M by the lower insulation layer 31. For example, the lower insulation layer 31 may be interposed between the plurality of mesas M and the current spreading layer 33 to insulate the current spreading layer 33 from the plurality of mesas M. Further, the lower insulation layer 31 may have openings 31b each placed within the upper region of each of the mesas M and exposing the reflective electrodes 30, and openings 31a exposing the first conductivity-type semiconductor layer 23. The current spreading layer 33 may be connected to the first conductivity-type semiconductor layer 23 through the openings 31a. The openings 31b of the lower insulation layer 31 have narrower areas than the openings 33a of the current spreading layer 33 and are completely exposed through the openings 33a.

The upper insulation layer 35 covers at least a portion of the current spreading layer 33. Further, the upper insulation layer 35 may have openings 35b exposing the reflective electrodes 30. Furthermore, the upper insulation layer 35 may have openings 35a exposing the current spreading layer 33. The upper insulation layer 35 may cover sidewalls of the openings 33a of the current spreading layer 33.

The first pad 37a may be disposed on the current spreading layer 33 and may be connected to the current spreading layer 33 through, for example, the openings 35a of the upper insulation layer 35. Further, the second pad 37b is connected to the reflective electrodes 30 exposed through the openings 35b. Although the first pad 37a is shown as having the same size as the second pad 37b in FIG. 6b, it should be understood that the present invention is not limited thereto and the first and second pads 37a and 37b may have different sizes. For example, the first pad 37a may be larger than the second pad 37b.

According to the present invention, the current spreading layer 33 covers the mesas M and substantially the entire region of the first conductivity-type semiconductor layer 23 between the mesas M. With this structure, the light emitting chip can achieve efficient current spreading through the current spreading layer 33.

Furthermore, the current spreading layer 23 may include a reflective metal layer such as an Al layer or the lower insulation layer may be formed as an insulation reflective layer such that light not reflected by the reflective electrodes 30 can be reflected by the current spreading layer 23 or the lower insulation layer 31, thereby improving extraction efficiency.

The light emitting device package 6 shown in FIG. 6a is generally similar to the light emitting device package 1 described with reference to FIG. 1. However, in the light emitting device package 6 shown in FIG. 6a, the wavelength conversion unit 121 may extend to side surfaces of the first and second pads 37a and 37b, and thus the reflective unit 130 may also be formed on outer side surfaces of the first and second pads 37a and 37b.

Each of the light emitting device packages 10, 20 and 30 described with reference to FIG. 1 to FIG. 6b does not include a separate secondary substrate or a separate lead electrode, and includes the light emitting chip 110, the wavelength conversion unit 121 and the reflective unit 130 formed integrally with each other, thereby achieving miniaturization.

FIG. 7 shows plan views of light emitting device packages according to yet another exemplary embodiment.

Each of light emitting device packages 7a and 7b shown in FIG. 7 is generally similar to the light emitting device package shown in FIG. 3a and FIG. 3b except that each of the light emitting device packages 7a, 7b includes a plurality of unit light emitting devices 10.

Referring to FIG. 7(a), the light emitting device package 7a includes six unit light emitting devices 10, in which one side surface of each of the unit light emitting devices 10 adjoins the other side surface of another unit light emitting device. Specifically, reflective units 130 of the unit light emitting devices 10 may adjoin each other, or one reflective unit 130 may be shared by adjacent unit light emitting devices 10.

The unit light emitting devices 10 may emit the same color or different colors. The unit light emitting devices 10 may be turned on or off simultaneously or independently.

Figure 7B:
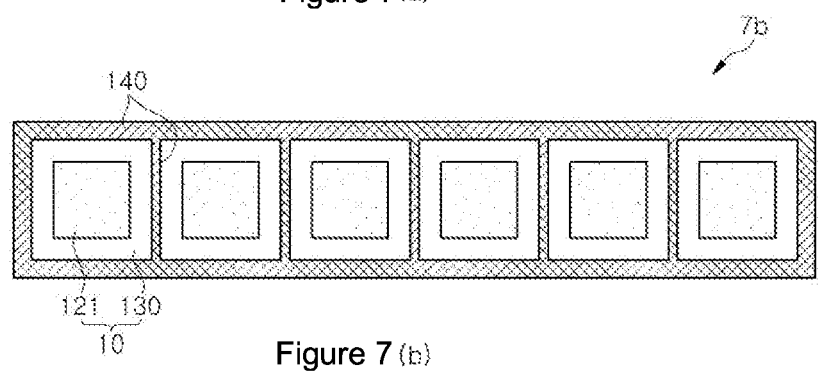

Referring to FIG. 7(b), the light emitting device package 7b includes six unit light emitting devices 10 and a light blocking unit 140 disposed between the unit light emitting devices 10. Alternatively, the same structure as that of the light emitting device package 7b may be formed by continuously connecting six light emitting device packages 3 as shown in FIG. 3a and FIG. 3b. The light blocking unit 140 is disposed between the unit light emitting devices 10, thereby minimizing color change due to light leakage of adjacent unit light emitting devices 10.

The light emitting device packages 7a and 7b according to this exemplary embodiment may be applied to vehicle lamps. Specifically, for example, the light emitting device package 7b as shown in FIG. 7(b) may be used as a taillight of a vehicle. In this case, the light emitting device package 7b may include white color-based unit light emitting devices 10 and amber-based unit light emitting devices 10 that are alternately arranged. Unlike the light emitting device package 7a as shown in FIG. 7(a), since the light blocking unit 140 is disposed between the unit light emitting devices 10 in the light emitting device package 7b as shown in FIG. 7(b), it is possible to prevent mixing of a white color and a yellow color in the reflective unit 130 when the white color-based and amber-based unit light emitting devices 10 are simultaneously turned on or off.

Although each of the light emitting device packages 7a and 7b according to the exemplary embodiment includes six unit light emitting devices 10, it should be understood that the present invention is not limited thereto. Arrangement of the light emitting device packages 7a and 7b, or the number or arrangement of unit light emitting devices 10 may be suitably adjusted depending upon user purpose as needed.

FIG. 8 shows plan views of a light emitting device package according to yet another exemplary embodiment.

Each of light emitting device packages 8a and 8b shown in FIG. 8 is generally similar to the light emitting device package shown in FIG. 7 except that each of the light emitting device packages 8a and 8b includes a plurality of unit light emitting devices 10 arranged in two lines.

Figure 8A:
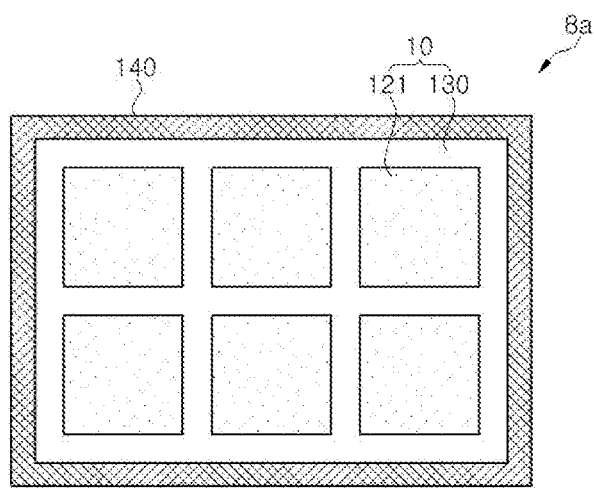
FIG. 8a and FIG. 8b show plan views of light emitting device packages according to yet another exemplary embodiment.

Referring to FIG. 8(a), the light emitting device package 8a includes six unit light emitting devices 10 arranged in two lines. Specifically, three unit light emitting devices 10 are arranged in an upper row and three unit light emitting devices 10 are arranged in a lower row. At least two side surfaces of the unit light emitting devices 10 may adjoin each other.

The light emitting device packages 8a and 8b according to this exemplary embodiment may be applied to a vehicle lamp. Specifically, for example, the light emitting device package 8a as shown in FIG. 8(a) may be used as a turn signal lamp of a vehicle. In this case, the light emitting device package may include white color-based unit light emitting devices 10 and amber-based unit light emitting devices 10 that are disposed so as not to contact each other. That is, when a white color-based unit light emitting device 10 is disposed at the leftmost side of the upper row, the amber-based unit light emitting device 10 may be arranged at the right side of and under the white color-based unit light emitting device 10.

The white color-based unit light emitting devices 10 and the amber-based unit light emitting devices 10 are alternately turned on or off so as to be used as the turn signal lamp for vehicles. In this case, only the same color-based unit light emitting devices 10 are simultaneously turned on or off, thereby preventing a problem of color mixing in the reflective unit 130.

Figure 8B:
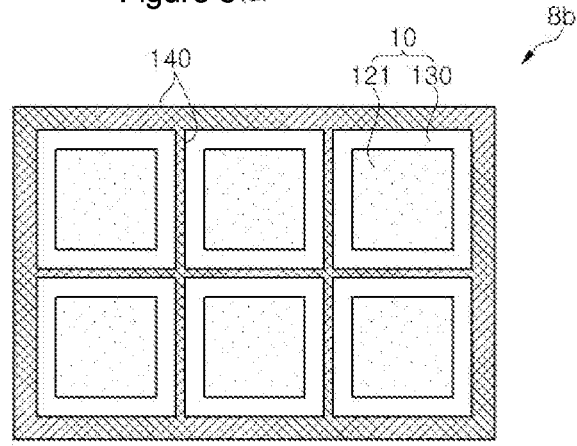

Referring to FIG. 8(b), the light emitting device package 8b includes a light blocking unit 140 disposed between unit light emitting devices 10 arranged in two lines. Alternatively, the same structure as that of the light emitting device package 8b may be formed by arranging six unit light emitting devices 10 in two lines. With the structure wherein the light blocking unit 140 is disposed between the unit light emitting devices 10, the light emitting device package can minimize color change due to light leakage of the unit light emitting devices 10.

The light emitting device packages 8a and 8b according to this exemplary embodiment can prevent occurrence of light leakage and thus can emit light providing a clear cutoff line to an illumination target. Although the vehicle lamp is illustrated by way of example in description of the above exemplary embodiments, the light emitting device packages 8a and 8b according to this exemplary embodiment are not limited thereto and may be used for various purposes as needed.

Figure 9A:
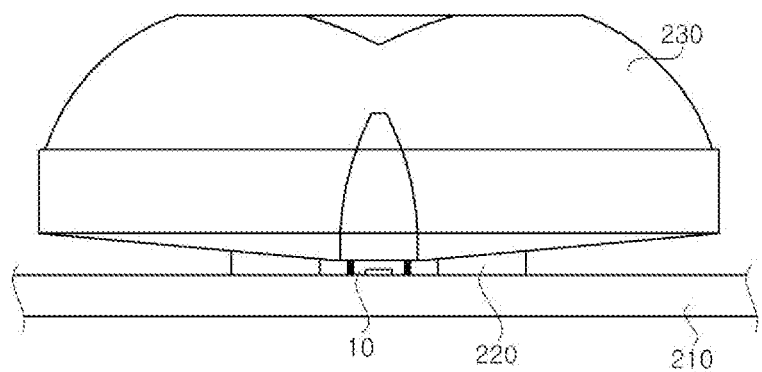
FIG. 9a and FIG. 9b are sectional views and plan views of a backlight unit including a light emitting device package according to exemplary embodiments.
Figure 9B:
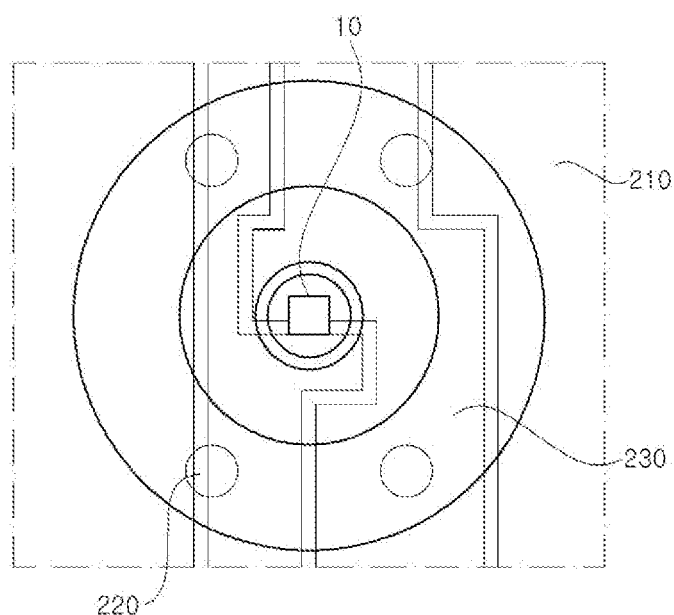

FIG. 9 is a sectional view and a plan view of a backlight unit including a light emitting device package according to exemplary embodiments.

Referring to FIG. 9, the backlight unit includes a unit light emitting device 10, a printed circuit board 210, support legs 220, and a lens 230. The unit light emitting device 10 may be disposed in a central region of the lens 230, which is supported by the support legs 220 to be separated from the printed circuit board 210.

A light blocking unit may be disposed on a side surface of the unit light emitting device 10 and interposed between a bottom of the lens 230 and the printed circuit board to prevent light emitted from the unit light emitting device 10 from leaking to a region other than the lens. With this structure, it is possible irradiate light as much as possible to a light incident portion of the lens 230, thereby improving contrast ratio and viewing angle of a display.

Although FIG. 9 shows a direct type backlight unit, the light emitting device package according to exemplary embodiments is not limited thereto and can also be applied to an edge type backlight unit.

FIG. 10 to FIG. 15 are plan views and a sectional view illustrating a method for manufacturing a light emitting device package according to one exemplary embodiment. FIG. 10 to FIG. 15 show at least a portion of a plurality of light emitting chips 110.

Referring to FIG. 10, a wafer 100 is prepared.

The wafer 100 may include a plurality of semiconductor stack structures, which may correspond to light emitting chip regions 110a. A region between the light emitting chip regions 110a is defined as a first isolation region S1.

Each of the plural light emitting chip regions 110a may be divided into an individual light emitting chip by subsequent processes, and each of the individual light emitting chips includes electrode patterns disposed on a lower surface thereof. For example, one of the light emitting chip regions 110a may take the form shown in FIG. 6b.

Next, referring to FIG. 11, the wafer 100 is divided into a plurality of individual light emitting chips 110 along the first isolation region S1, and the light emitting chips 110 are arranged on a first support substrate 200 to be separated from each other. Here, the light emitting chips 110 are preferably arranged such that the electrode patterns of the light emitting chips 111 face downwards. The light emitting chips 110 may be arranged substantially at the same intervals on the first support substrate 200. Accordingly, a wavelength conversion unit 121 configured to cover upper surfaces and side surfaces of the light emitting chips 110 may be formed to have substantially the same thickness at a side surface thereof with respect to all of the light emitting chips 110 by a subsequent process. As such, the light emitting chips 110 arranged on the first support substrate 200 may be obtained from the same wafer 100.

Next, referring to FIG. 12a, the wavelength conversion unit 121 is formed to cover an upper surface and a side surface of each of the light emitting chips 110. Here, a region between the light emitting chips 110 is defined as a second isolation region S2. FIG. 12b is a sectional view taken along line A-A' of FIG. 12a, and the wavelength conversion unit 121 is provided to the upper surfaces of the light emitting chips 110 and to a region between the light emitting chips 110 in a shape as shown in FIG. 12b.

As described above, the wavelength conversion unit 121 may include a resin and a phosphor, and may be formed by depositing a mixture of the phosphor and the resin onto the first support substrate 200, followed by curing. For example, the mixture of the phosphor and the resin may be deposited onto the first support substrate 200 so as to cover side surfaces and upper surfaces of the light emitting chips 110 by printing, dispensing, spraying, or the like. Then, the mixture is cured by heat curing or the like, thereby forming the wavelength conversion unit 121. However, it should be understood that the present invention is not limited thereto and the wavelength conversion unit 121 may be formed by various methods without departing from the scope of the present invention.

Referring to FIG. 13, the wavelength conversion unit 121 is divided into a plurality of individual light emitting device units 110b each including the light emitting chip 110 and the wavelength conversion unit 121 along the second isolation region S2, and the individual light emitting device units 110b are disposed on a second support substrate 300 to be separated from each other. Division of the wavelength conversion unit 121 may be performed using a metal blade or a laser.

The individual light emitting device units 110b may be arranged substantially at the same intervals on the second support substrate 300. Accordingly, a reflective unit 130 configured to cover the side surfaces of the light emitting chips 110 may be formed to have substantially the same thickness at a side surface thereof with respect to all of the light emitting chips 110 by a subsequent process.

The first support substrate 200 and the second support substrate 300 are provided as temporary substrates used in the manufacturing process, and thus are not limited to a particular kind of substrate. For example, the first support substrate 200 and the second support substrate 300 may be glass substrates.

The method according to this embodiment may further include performing plasma treatment with respect to side surfaces of the individual light emitting device units 110b. By plasma treatment, a functional group may be provided to the side surface of the wavelength conversion unit 121 of each of the individual light emitting device units 110b, thereby improving bonding strength and adhesion between the wavelength conversion unit 121 and the reflective unit 130.

Referring to FIG. 14, a reflective unit 130 is formed to fill a region between the individual light emitting device units 110b on the second support substrate 300. Accordingly, the reflective unit 130 covers the side surfaces of the individual light emitting device units 110b, that is, the side surfaces of the light emitting chips 110.

The reflective unit 130 may be formed in a similar manner as in formation of the wavelength conversion unit 121, and may include a resin and/or fillers, as described above.

The manufacturing method according to this exemplary embodiment may further include performing planarization with respect to at least one of an upper surface of the reflective unit 130 and an upper surface of the wavelength conversion unit 121 after formation of the reflective unit 130. Planarization may be performed by grinding, cutting, or the like. When the reflective unit 130 is formed by deposition, the reflective unit 130 can be formed on the wavelength conversion unit 121 due to conditions of the manufacturing process. Since the reflective unit 130 formed on the wavelength conversion unit 121 can be removed by planarization, it is possible to prevent the reflective unit 130 from residing on the light emitting chip 110 in a final light emitting device package 1. Furthermore, the upper surface of the wavelength conversion unit 121 can become flush with the upper surface of the reflective unit 130 through planarization, whereby a subsequent process for forming a lens 150 can be more stably performed.

Then, referring to FIGS. 15(a) and (b), the lens 150 is formed on each of the individual light emitting device units 110b and the reflective unit 130 is divided into individual light emitting device units 110c along a third isolation region S3 between the individual light emitting device units 110b.

The lens 150 may be formed by molding, may be disposed on each of the individual light emitting device units 110b after being separately manufactured, or may be formed by various other methods.

As shown in the drawings, the lens 150 may have a semi-spherical shape as shown in the drawings, or may have other shapes such as a planar shape and a shape with a concave portion at a center thereof in order to obtain a desired orientation pattern of light. Further, a lower surface of the lens 150 may be larger than the size of the individual light emitting device unit 110b, and the lens 150 may be formed to cover the entirety of an upper surface of the individual light emitting device unit 110b. In some exemplary embodiments, the lens 150 may be omitted.

The individual light emitting device units 110c are separated from each other, thereby providing the light emitting device packages 1 as shown in FIG. 1.

A method for manufacturing a light emitting device package according to another exemplary embodiment may further include forming a light blocking unit 140 covering at least one side surface of each of the individual unit light emitting devices before forming the lens 150.

Figure 16:
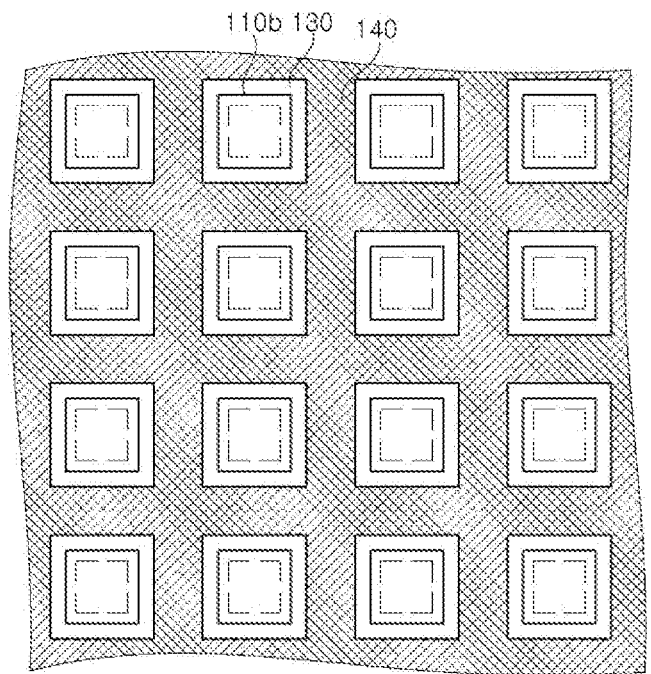
FIG. 16a and FIG. 16b are plan views illustrating a method for manufacturing a light emitting device package according to another exemplary embodiment.
Figure 16:
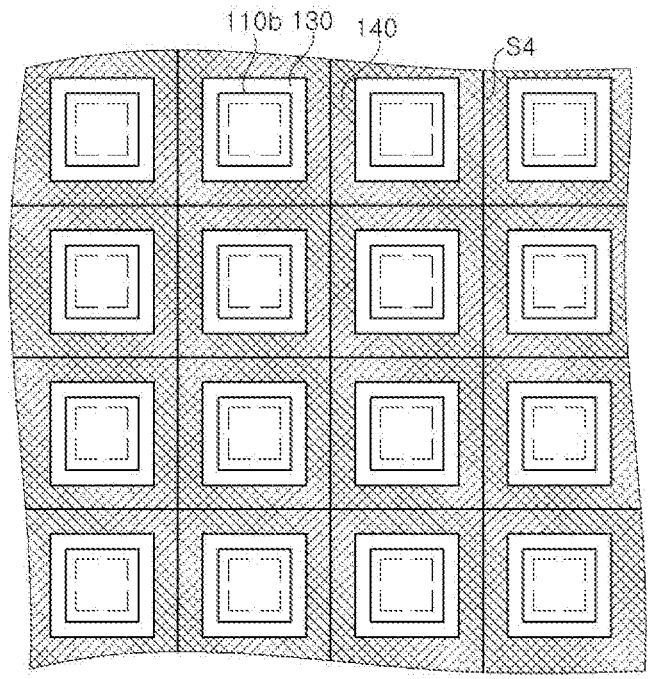

Referring to FIG. 16(a), the individual light emitting device units having the reflective unit 130 formed thereon are disposed on a separate support substrate to be separated from each other, and then a light blocking unit 140 is formed to fill a space between the individual light emitting device units. Here, it is possible to determine the thickness of the side surface of the light blocking unit 140 in the light emitting device package by adjusting the distance between the individual light emitting device units.

The light blocking unit 140 may be formed of a material having high absorptivity of light. The light blocking unit 140 may be formed of a material having higher absorptivity of light than the reflective unit 130. For example, the light blocking unit 140 may be formed of a black material having high absorptivity of light. As the material for the light blocking unit 140, any material may be used so long as the material has high absorptivity of light and, for example, the light blocking unit 140 may include a light absorption material, such as carbon black, a black resin, and a black paint.

The light blocking unit 140 may be formed by various methods such as coating and curing, deposition and curing, and the like. In addition, an upper surface of the light blocking unit 140 may be formed to have the same height as the upper surface of the reflective unit 130, and, for example, the upper surface of the light blocking unit 140 may become flush with the upper surface of the reflective unit 130 by planarization. However, it should be understood that the present invention is not limited thereto, and the upper surface of the light blocking unit 140 is not necessarily be formed to be flush with the upper surface of the reflective unit 130.

Next, referring to FIG. 16(b), the light blocking unit 140 is divided along a fourth isolation region S4 between the individual light emitting units, thereby providing light emitting device packages 5 as shown in FIG. 5.

Further, when the lens 150 is further formed on each of the individual light emitting device units before division of the light blocking unit 140, light emitting device packages 6 as shown in FIG. 4 can also be provided.

FIG. 17 to FIG. 21 are plan views and a sectional view illustrating a method for manufacturing a light emitting device package according to a further exemplary embodiment. FIG. 17 to FIG. 21 show at least a portion of a plurality of light emitting chips 110.

The method according to this exemplary embodiment is generally similar to the method described with reference to FIG. 10 to FIG. 15 except that, in this method, a wavelength conversion unit 123 is formed on a wafer 100 before division of the wafer 100. The following description will be mainly given of different features of the method according to this exemplary embodiment.

Referring to FIG. 17, a wafer 100 as shown in FIG. 10 is prepared. Here, each of light emitting chip regions 110a may have electrode patterns disposed on a lower surface of the wafer 100.

Referring to FIG. 18, a wavelength conversion unit 123 is formed to cover an upper surface of the wafer 100. That is, in the above exemplary embodiment shown in FIG. 10 to FIG. 15, the wavelength conversion unit 121 is formed after division of the wafer 100 along the first isolation region S1, whereas the wavelength conversion unit 123 is formed before division of the wafer 100 in this exemplary embodiment. The wavelength conversion unit 123 may be formed in a similar manner as in the method described in the above exemplary embodiments.

Next, referring to FIG. 19a, the wafer 100 is divided into a plurality of individual light emitting device units 110d along a first isolation region S1, and the light emitting device units 110d are arranged on a first support substrate 200 to be separated from each other. The individual light emitting device units 110d may be light emitting chips 110 having a wavelength conversion unit 123 formed thereon. FIG. 19b is a sectional view taken along line B-B' of FIG. 19a.

Since the wavelength conversion unit 123 is divided and separated together with the wafer 100, a side surface of each light emitting chip 110 may be coplanar to the side surface of the wavelength conversion unit 123 in the individual light emitting device unit 110d. Further, the wavelength conversion unit 123 may have a flat bar shape.

Then, referring to FIG. 20 and FIG. 21, a reflective unit 130 is formed to fill a space between the individual light emitting device units 110d, and a lens 150 is formed on each of the light emitting chips 110, followed by dividing the reflective unit 130 along a fourth isolation region S4 to provide individual light emitting device units 110e. As a result, a plurality of light emitting device packages 2 as shown in FIG. 2 is provided.

The processes of forming the reflective unit 130 and the lens 150 and the process of dividing the reflective unit 130 are substantially similar to the processes described with reference to FIG. 10 to FIG. 15, and detailed descriptions thereof will be omitted.

According to this exemplary embodiment, a plurality of miniaturized light emitting device packages can be provided by forming the wavelength conversion unit 121 or 123 and the reflective unit 130 with respect to a plurality of light emitting chips at a wafer level, followed by dividing. Accordingly, a separate packaging process can be omitted and a plurality of light emitting chips is packaged by a single packaging process, thereby enabling simplification of the process of manufacturing a light emitting device package. Furthermore, since a separate substrate for formation of the lens can be omitted by directly forming the lens on the reflective unit 130, it is possible to manufacture a miniaturized light emitting device package through the manufacturing method as described above.

It should be understood that the present invention is not limited to the exemplary embodiments and features described above and that various modification, variations, and alterations can be made without departing from the spirit and scope of the present invention.

The invention claimed is:
1. A light emitting device package comprising:
a first light emitting device; and
a second light emitting device,
wherein each of the first light emitting device and the second light emitting device includes:

a light emitting chip having an upper surface, a side surface and a lower surface;

a wavelength conversion unit including a first portion covering the upper surface and a second portion covering a side surface of the light emitting chip, the wavelength conversion unit having external side surfaces extending in a direction parallel to the side surface of the light emitting chip; and a reflective unit disposed on the external side surfaces of the wavelength conversion unit and covering the second portion of the wavelength conversion unit, and wherein the light emitting chip includes electrode pads disposed on the lower surface of the light emitting chip and exposed on an outside surface of the light emitting chip, and wherein the first light emitting device and the second light emitting device emit at least two of a white colored light, an amber-based colored light, a red-based colored light, or a green-based colored light, wherein the light emitting device package further comprises a light blocking unit disposed on side surfaces of the reflective unit and including light absorption material, and wherein the wavelength conversion unit, the reflective unit and the light blocking unit are sequentially located in a direction further away from the light emitting chip.

2. The light emitting device package of claim 1, wherein the wavelength conversion unit includes a phosphor and a resin.

3. The light emitting device package of claim 1, wherein the light emitting chip comprises a first conductivity type semiconductor layer, a second conductivity type semiconductor layer, an active layer between the first conductivity type semiconductor layer and the second conductivity type semiconductor layer.

4. The light emitting device package of claim 1, wherein the first light emitting device and the second light emitting device are configured to be turned on or off simultaneously or independently.

5. The light emitting device package of claim 1, wherein the reflective unit includes a resin.

6. A vehicle lamp comprising:

a light emitting device package comprising a first light emitting device and a second light emitting device, and wherein each of the first light emitting device and the second light emitting device includes:

a light emitting chip having an upper surface, a side surface and a lower surface;

a wavelength conversion unit including a first portion covering the upper surface and a second portion covering a side surface of the light emitting chip, the wavelength conversion unit having external side surfaces extending in a direction parallel to the side surface of the light emitting chip; and a reflective unit disposed on the external side surfaces of the wavelength conversion unit and covering the second portion of the wavelength conversion unit, and wherein the light emitting chip includes electrode pads disposed on the lower surface of the light emitting chip and exposed on an outside surface of the light emitting chip, wherein the first light emitting device and the second light emitting device emit at least two of a white colored light, an amber-based colored light, a red-based colored light, or a green-based colored light, and wherein the first light emitting device emits the white-based colored light and the second light emitting device emits the amber-based colored light, wherein the light emitting device package further comprises a light blocking unit disposed on side surfaces of the reflective unit and including light absorption material of each of the first light emitting device and the second light emitting device, and wherein, for each of the first light emitting device and the second light emitting device, the wavelength conversion unit, the reflective unit and the light blocking unit are sequentially located in a direction further away from the light emitting chip.

7. The vehicle lamp of claim 6, wherein the first light emitting device and the second light emitting device are not simultaneously turned on or off.

8. The vehicle lamp of claim 7, wherein the light emitting chip comprising:

a first conductivity type semiconductor layer;

a mesa formed on the first conductivity type semiconductor layer;

reflective electrodes disposed on the mesa;

a current spreading layer covering the first conductivity type semiconductor layer and the mesa;

a lower insulation layer interposed between the mesa and the current spreading layer; and an upper insulation layer covering at least a portion of the current spreading layer and including openings, the reflective electrodes exposed through the openings.

9. The vehicle lamp of claim 8, the light emitting chip further comprises a growth substrate.

10. The vehicle lamp of claim 6, wherein the wavelength conversion unit includes at least one of a phosphor or a resin and has a side surface subjected to plasma treatment.

11. The vehicle lamp of claim 6, wherein the light absorption material absorbs light better than the reflective unit, and the light absorption material includes carbon black, a black resin, and a black paint.

12. The vehicle lamp of claim 6, wherein an upper surface of the light blocking unit is flush with or higher than an upper surface of the reflective unit.

13. The vehicle lamp of claim 6, wherein an upper surface of the wavelength conversion unit is flush with an upper surface of the reflective unit.

14. The vehicle lamp of claim 6, further comprising an additional first light emitting device and an additional second light emitting device.

15. The vehicle lamp of claim 14, wherein the first light emitting device, the second light emitting device, the additional first light emitting device, and the additional second light emitting device are arranged in multiple lines.

16. The vehicle lamp of claim 6, wherein the first light emitting device and the second light emitting device are alternately arranged.

17. The vehicle lamp of claim 6, wherein the first light emitting device and the second light emitting device are disposed apart from each other.

18. The vehicle lamp of claim 6, wherein the first light emitting device and the second light emitting device provide turn signal lights for a vehicle.

* * * * *